United States Patent [19]
Rodman et al.

[11] Patent Number: 5,883,471
[45] Date of Patent: Mar. 16, 1999

[54] FLASHLAMP PULSE SHAPER AND METHOD

[75] Inventors: Jeffrey C. Rodman, San Francisco; Stan Noel, Redwood City, both of Calif.

[73] Assignee: Polycom, Inc., San Jose, Calif.

[21] Appl. No.: 879,853

[22] Filed: Jun. 20, 1997

[51] Int. Cl.[6] .............................. H05B 41/37; B60Q 1/00
[52] U.S. Cl. .................. 315/200 A; 315/241 S; 315/214 P; 315/209 CD; 315/DIG. 5; 340/105; 340/77
[58] Field of Search ..................... 315/290, 307, 315/289, 209 CD, 241 P, 209 M, DIG. 5, 244, 200 A, 241 S

[56] References Cited

U.S. PATENT DOCUMENTS

| | | | |
|---|---|---|---|
| 2,768,517 | 10/1956 | Atkinson et al. | 67/31 |
| 3,167,014 | 1/1965 | Kopito | 102/28 |
| 3,486,070 | 12/1969 | Engel | 315/225 |
| 3,517,196 | 6/1970 | Owens | 250/201 |
| 3,517,197 | 6/1970 | Poeschl et al. | 250/201 |
| 3,555,394 | 1/1971 | Bramer et al. | 320/1 |
| 3,619,638 | 11/1971 | Phinney | 307/106 |
| 3,751,652 | 8/1973 | Peterson et al. | 240/1.3 |
| 3,810,212 | 5/1974 | Biber | 315/241 P |
| 3,858,227 | 12/1974 | Ellin et al. | 354/145 |
| 3,882,839 | 5/1975 | Ganoung | 123/148 |
| 4,082,985 | 4/1978 | Bolhuis | 315/241 P |
| 4,325,004 | 4/1982 | Proud et al. | 315/45 |
| 4,379,982 | 4/1983 | Proud | 315/73 |
| 4,477,796 | 10/1984 | Kearsley | 315/200 A |
| 4,629,945 | 12/1986 | Fallier. Jr. et al. | 315/207 |
| 4,684,820 | 8/1987 | Valencia | 307/106 |
| 4,704,543 | 11/1987 | Barker et al. | 307/106 |
| 4,733,153 | 3/1988 | Katzenstein | 320/1 |
| 4,808,368 | 2/1989 | Humphreys | 376/118 |
| 4,996,495 | 2/1991 | Birx | 328/65 |
| 5,118,995 | 6/1992 | Hauser | 315/241 S |
| 5,264,895 | 11/1993 | Takashashi et al. | 315/241 P |

*Primary Examiner*—Don Wong
*Assistant Examiner*—Wilson Lee
*Attorney, Agent, or Firm*—Carl & Ferrell LLP

[57] ABSTRACT

A circuit and method for energizing a discharge device, such as a flashlamp. A discharge device is electrically coupled to a pair of capacitors which are both charged to a desired potential level. One of the capacitors discharges through the discharge device to initially energize the discharge device until its potential level falls below the potential level of the other capacitor whereupon the other capacitor commences to discharge through the discharge device to sustain the energization of the discharge device.

12 Claims, 5 Drawing Sheets

FLASHLAMP PULSE SHAPER AND METHOD

BACKGROUND OF THE INVENTION

1. Field of the Invention

This invention is related to energizing a discharge device, such as lamps producing a light flash of intense brilliance. More specifically, the present invention provides a circuit for producing sufficient current to energize a flashlamp and to sustain the energization of the flashlamp for a desired period of time. The present invention also provides a method for energizing a flashlamp by providing a brief high-voltage pulse to energize a flashlamp, and a longer lower-voltage pulse to sustain it. This increases the life of the flashlamp by minimizing the time for which an unnecessarily high current passes between its electrodes.

2. Description of the Prior Art

In flashlamp circuits, lamp life of a flashlamp is an important factor. The number of flashes that a flashlamp can produce at acceptable light levels is one important parameter of its performance. A typical flashlamp circuit, such as the one shown in FIG. 1 and as further discussed below, includes a charging circuit to convert an available voltage to a higher voltage as required to operate the flashlamp, a capacitor to hold an electrical charge as it is developed and to supply it in one large, fast surge once the flashlamp is triggered, and a trigger transformer to initiate ionization of gas contained in the flashlamp. To initiate a flash, a high voltage is applied to the outside surface of the flashlamp. This allows current to start to flow within the lamp, provided that there is sufficient voltage between the electrodes of the flashlamp. Once current flow has started, the flashlamp has a nonlinear but positive resistance; the higher the voltage, the higher the current. In such a conventional circuit, the current begins at a high value (for a small camera flashlamp, this can be 200–300 amperes). As current flows, the capacitor discharges, its voltage falls, and the current consequently falls into the 50–150 amp range. Finally, there is insufficient current to sustain the discharge and the process ceases. The high-current initial transient is necessary because the flashlamp requires a high voltage between its terminals to start the arc. The shape of the curve, then, is determined by the V/I curve of the flashlamp as applied against the size of the holding capacitor, modified by whatever other components and parasitics lie along the path (e.g. gating transistor or SCR, shaping inductors, etc.)

In such conventional flashlamp circuits, flashlamps may be damaged in several ways. The envelope of the flashlamp can develop a set of fine cracks due to repeated acoustic shocks from discharge. Also, vaporization of the electrodes of the flashlamp may degrade their shapes, or the material of the electrodes may be vaporized and redeposited on the inside of the envelope, causing irregular darkening of the envelope.

In response to these problems, the prior art has provided a number of solutions for extending the lamp life of a flashlamp. The use of a more durable material, such as quartz, for the envelope can make it more resistant to cracking due to the repeated acoustic shocks from discharge. Complex electrode formulations and fabrication also increase life. Both of these solutions however come at added cost. Another solution for extending the lamp life of a flashlamp include reducing the amount of energy passed through the flashlamp at each flash. This causes a concomitant problem of reduced flash light output. Another solution for extending the lamp life is to smear and shape the initial high current part of the capacitor discharge with an inductor. This is usually of limited utility, since an inductor must be both large and efficient at high currents; typically, 100 microhenries or greater in order to function well at 300 amps. Such an inductive device will be large and expensive.

Therefore, what is needed and what has been invented is a flashlamp circuitry and method of prolonging the lamp life of a flashlamp wherein more flashes may be achieved, especially with a low-cost bulb, without compromising the light output of the flashlamp.

SUMMARY OF THE INVENTION

The present invention accomplishes its desired objects by broadly providing a method for energizing a discharge device comprising the steps of:

a) engaging a discharge device with a first capacitive element and a second capacitive element;

b) charging the first capacitive element to a first potential level, which is preferably greater than about 300 volts, especially for a typical small flashlamp;

c) charging the second capacitive element to a second potential level which is lower than the first potential level;

d) discharging the first capacitive element through the discharge device; and e) subsequently discharging the second capacitive element through the discharge device after the first capacitive element has been discharging through the discharge device for a period of time, such as a period of time ranging from about 0.1 microsecond to about 25 microseconds. In a preferred embodiment of the invention, the discharge device is a flashlamp, and the second capacitive element begins to discharge through the discharge device when the first potential level falls below the second potential level. The first capacitor element has a suitable value, such as a value ranging from about 0.1 $\mu F$ to about 20 $\mu F$, and the second capacitive element has a value ranging from about 100 $\mu F$ to about 5000 $\mu F$ with the second potential level having a value ranging from about 80 volts to less than 300 volts.

The present invention further accomplishes its desired objects by broadly providing a method for energizing a discharge device comprising the steps of:

a) engaging a discharge device with a first capacitive element and a second capacitive element;

b) charging the first capacitive element with an electrical charge of a first potential level;

c) charging the second capacitive element with an electrical charge of a second potential level which is different from the first potential level; and d) applying a difference in potential in close proximity to the discharge device, causing current to flow through the discharge device from discharge of the electrical charge of the first capacitive element through the discharge device. The discharge device is thereby energized. After the first potential level of the first capacitive element commences to decline below the second potential level of the second capacitive element, the second capacitive element commences to discharge through the discharge device for continued energization of the discharge device for a desired period of time.

The present invention also accomplishes its desired objects by broadly providing a method for prolonging a lamp life of a flashlamp comprising the steps of:

a) providing a flashlamp having an outside surface and containing a gas that is capable of being ionized;

b) electrically engaging the flashlamp of step (a) to a first condenser means for storing an electrical charge of a first potential level;

c) electrically engaging the flashlamp of step (a) to a second condenser means for storing an electrical charge of a second potential level;

d) charging the first condenser means with an electrical charge of a first potential level;

e) charging the second condenser means with an electrical charge of a second potential level; and f) applying a difference in potential in close proximity to the outside surface of the flashlamp, causing the gas of step (a) to ionize and to commence the flow of current through the flashlamp from the discharge of the electrical charge of the first condenser means of step (d) through the flashlamp. The flashlamp is thereby illuminated by the discharge of the first condenser means until the first potential level is attained; whereafter the second condenser means of step (e) commences to discharge its electrical charge through the flashlamp to sustain the illumination of the flashlamp, while providing for prolongation of the lamp life of the flashlamp.

The present invention further also accomplishes its desired objects by providing a circuit for illuminating a flashlamp comprising a first capacitor for storing an electrical charge of a first potential; and a second capacitor for storing an electrical charge of a second potential. A first transformer is electrically coupled to the first capacitor and to the second capacitor. A power means, electrically coupled to the transformer, is provided for supplying electrically power to the transformer such that the transformer charges the first capacitor to the first potential and the second capacitor to the second potential. The circuit also comprises a flashlamp having an outside surface and electrically coupled to the first capacitor and to the second capacitor; and a second transformer electrically coupled to the flashlamp for applying a difference in potential to the outside surface of the flashlamp, causing current to flow through the flashlamp from the discharge of the first capacitor through the flashlamp. The flashlamp is thereby illuminated until the first potential is attained. After the first potential falls below the second potential, the second capacitor commences discharging through the flashlamp to sustain the illumination of the flashlamp for a desired period of time.

It is therefore an object of the present invention to provide a method for energizing a discharge device, such as a flashlamp.

It is another object of the present invention to provide a method for prolonging the life of a discharge device, such as a flashlamp.

It is yet another object of the present invention to provide a circuit for illuminating a flashlamp.

These, together with the various ancillary objects and features which will become apparent to those skilled in the art as the following description proceeds, are attained by this novel circuit and method, a preferred embodiment thereof shown with reference to the accompanying drawings, by way of example only, wherein:

DETAILED DESCRIPTION OF PREFERRED EMBODIMENT OF THE INVENTION

Figure 1:
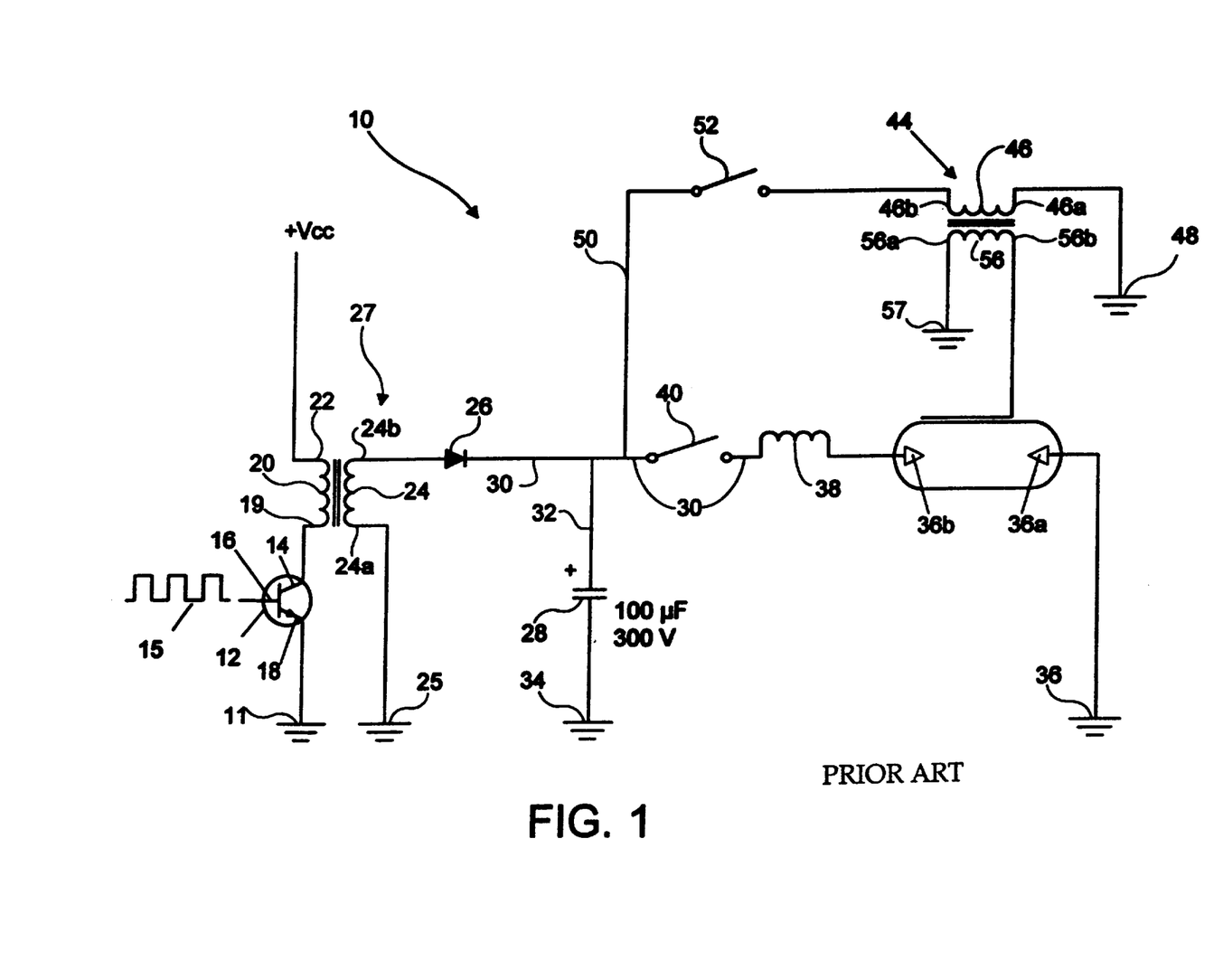
FIG. 1 is a schematic diagram of a prior art flashlamp circuit.

Referring in detail now to drawings wherein similar parts of the present invention are identified by like reference numerals, therein is seen in FIG. 1 a prior art flashlamp circuitry, generally illustrated as 10, including a NPN transistor 12 having a collector 14, a base 16 and an emitter 18. The transistor 12 substantially rectifies a square-shaped wave 15 emanating from any suitable square wave generating circuit (not shown in the drawings). The transistor 12 switches on and off to put an AC driving signal on a primary winding 22 of a transformer, generally illustrated as 20. The emitter 18 of the transistor 12 is grounded at 11.

The collector 14 of the transistor 12 is electrically coupled through a conductor 19 to the primary winding 22 of the transformer 20. The transformer 20 is a step-up transformer with a secondary winding 24 having one end 24a grounded at 25 and another end 24b electrically coupled to a condenser or capacitor 28 by conductors 30 and 32. A rectifier (i.e. a diode) 26 is electrically disposed with conductor 30 between transformer 20 and capacitor 28 which is conveniently grounded at 34. Transistor 12, transformer 20 and rectifier 26, along with the associated conductors, all represent a charging circuit which is generally illustrated as 27 in FIG. 1. Charging circuit 27 functions to charge the capacitor 28 to a desired electrical charge at a desired potential. Capacitor 28 stores the desired electrical charge of the desired potential.

Continuing to refer to the prior art flashlamp circuitry 10 in FIG. 1, a flashlamp 36 is connected to conductor 30. An inductor 38 may be disposed with conductor 30 in series with the primary current path for introducing inductance into the flashlamp circuitry 10. Inductor 38 is an optional electrical element. It functions to limit the rate at which current can change. This has a slight softening effect on the high-current transient which occurs at the beginning of a typical capacitor discharge. However, as mentioned above, it is usually impractical to use an inductor large enough to substantially improve the prior art flashlamp circuitry 10.

Flashlamp 36 has an outside surface 36a and is a standard conventional flashlamp which contains gases, usually noble gases (e.g. xenon, neon, etc.), that are capable of being ionized when a difference in potential is applied in close proximity to the outside surface 36a. Flashlamp 36 possesses electrodes 36b and 36b and is grounded at 39. A switch 40 (e.g. a camera shutter switch or the like) is provided within conductor 30 to close the circuit and allow the capacitor 28 to dump its associated electrical charge through the flashlamp 36 to illuminate the same.

A trigger transformer, generally illustrated as 44, is provided for receiving electrical power from transformer 20 and for furnishing a difference in potential to the outside surface 36a of the flashlamp 36. Trigger transformer 44 contains a primary winding 46 having one end 46a grounded at 48 and another end 46b connected to conductor 50 which electrically connects to conductor 30 between switch 40 and rectifier 26. Conductor 50 contains a switch 52 which when closed allows current to be conducted to the trigger transformer 44 via conductor 50. Trigger transformer 44 is a step-up transformer and also contains a secondary winding 56 having an end 56a grounded at 57 and another end 56b extending to the outside surface 36a such that when the trigger transformer 44 is energized, a difference in potential is applied around the flashlamp 36 which causes the gas contained therein to ionize. Before or simultaneously with the closure of switch 52, switch 40 is closed for conducting to the flashlamp 36 via conductors 32 and 30 the electrical charge stored by the capacitor 28. Ionization of the gas within the flashlamp 36 allows current to start to flow within the flashlamp 36, if there is sufficient voltage between the electrodes 36b and 36b. Once current flow has started, the flashlamp 36 has a nonlinear but positive resistance; the higher the voltage the higher the current.

Figure 2:
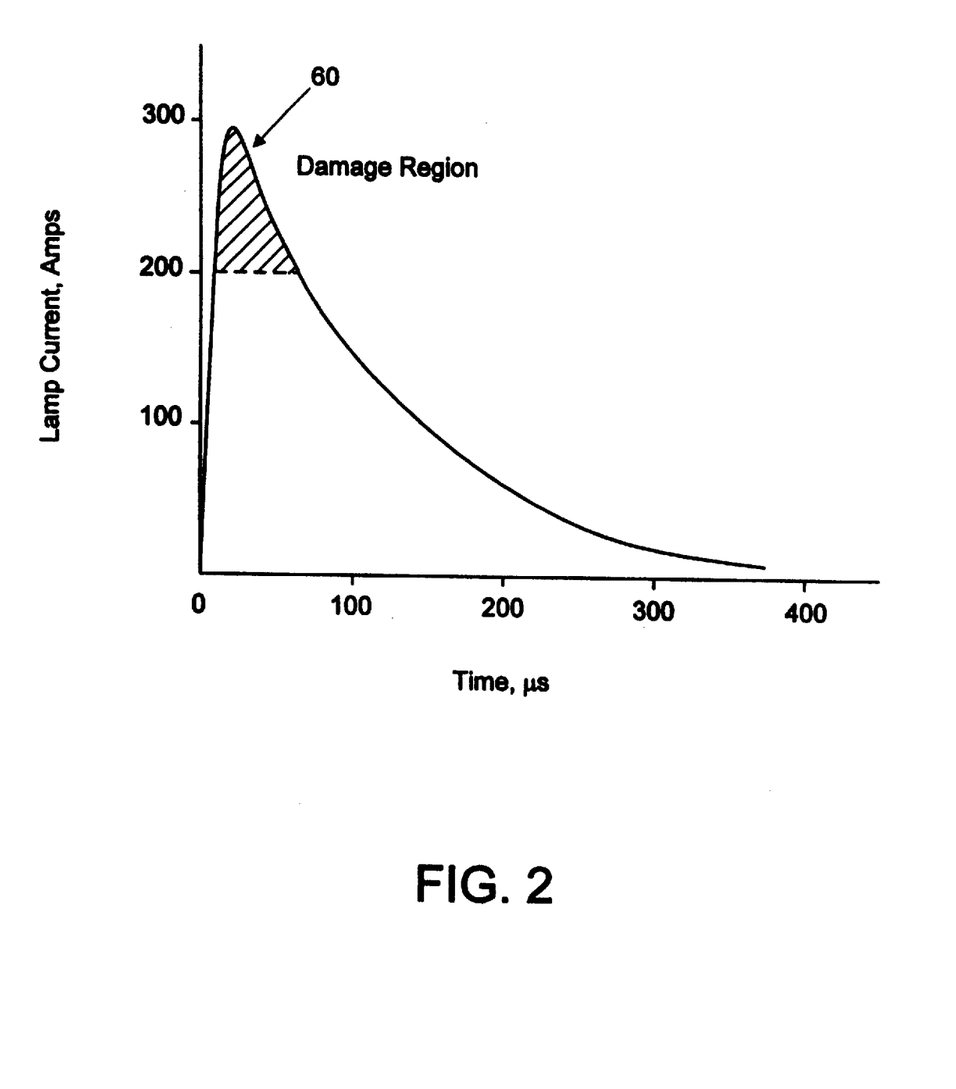
FIG. 2 is a representative prior art discharge curve of amperes vs. time in microseconds for the prior art flashlamp circuit of FIG. 1.

In this conventional circuit and as best shown in FIG. 2, the current begins at a high value (for a small camera flashlamp, this can be 200–300 amperes). As current flows, the capacitor 28 discharges, its voltage falls, and the current consequently falls into the 50–150 amp range. Finally, there is insufficient current to sustain the discharge and the process ceases as further best shown in FIG. 2.

The high-current initial transient is necessary because the flashlamp 36 requires a high voltage between its terminals to start the arc. The shape of the curve, then, is determined by the V/I curve of the lamp as applied against the size of the holding capacitor 28, modified by whatever other components and parasitics lie along the path (gating transistor or SCR, shaping inductors, etc.). Major damage to the flashlamp 36 occurs when the current extends above 200 amps, which is the damage region in the graph of FIG. 2, generally illustrated as 60.

It turns out that aging effects of flashlamps are highly dependent on the peak lamp current, and the integrated time over which the peak current is applied. In electrode aging, there is a current beyond which electrode metal is removed from the electrode at a highly accelerated rate and deposited on the inside of the envelope as well as on the other electrode. In addition, the shocks which cause glass cracking are much more a function of the integrated peak current than of the integrated current; that is, the current peak that occurs at the beginning of each flash is responsible for the bulk of the damage.

Figure 3:
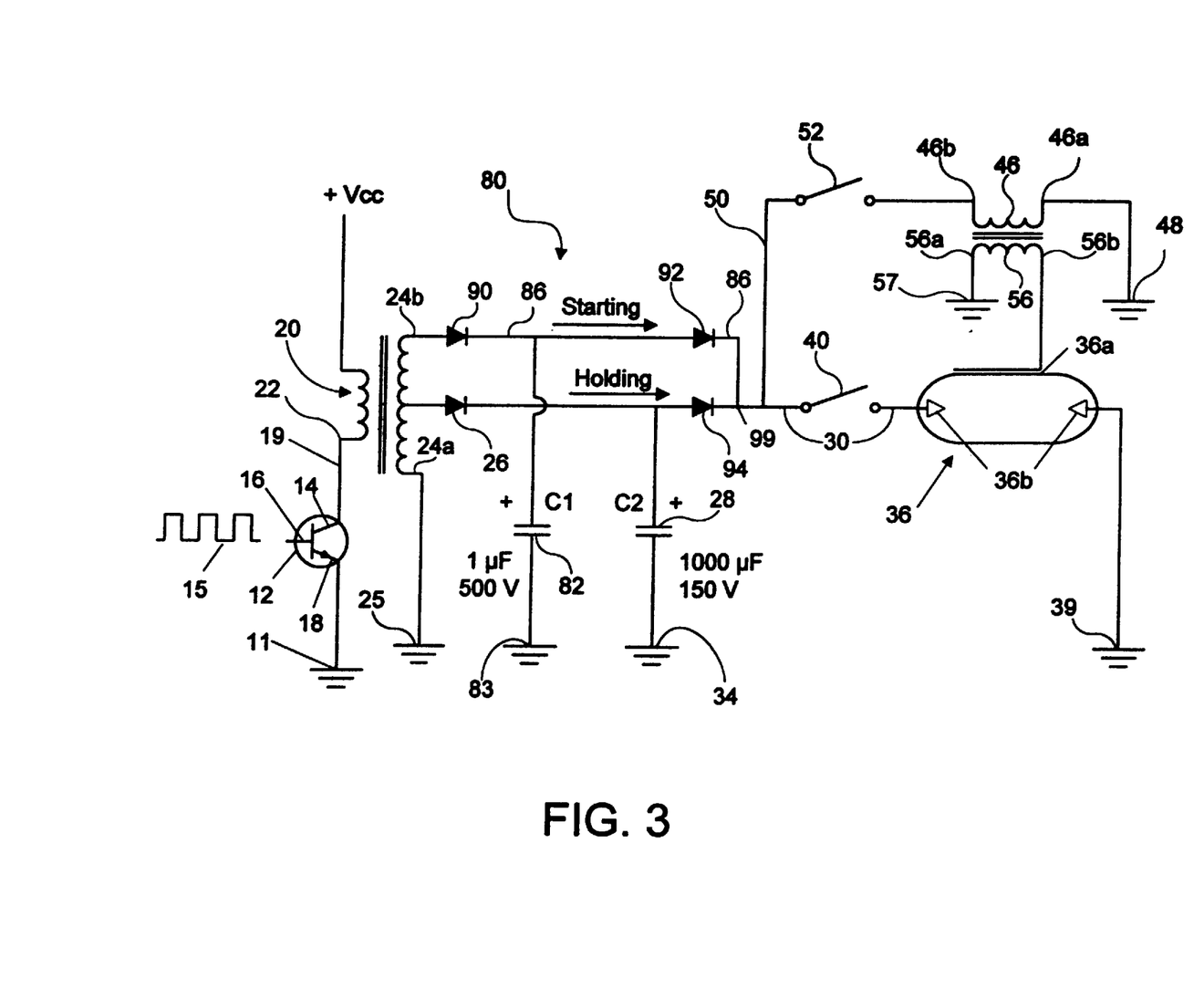
FIG. 3 is a schematic diagram of the flashlamp circuit for the present invention.
Figure 4:
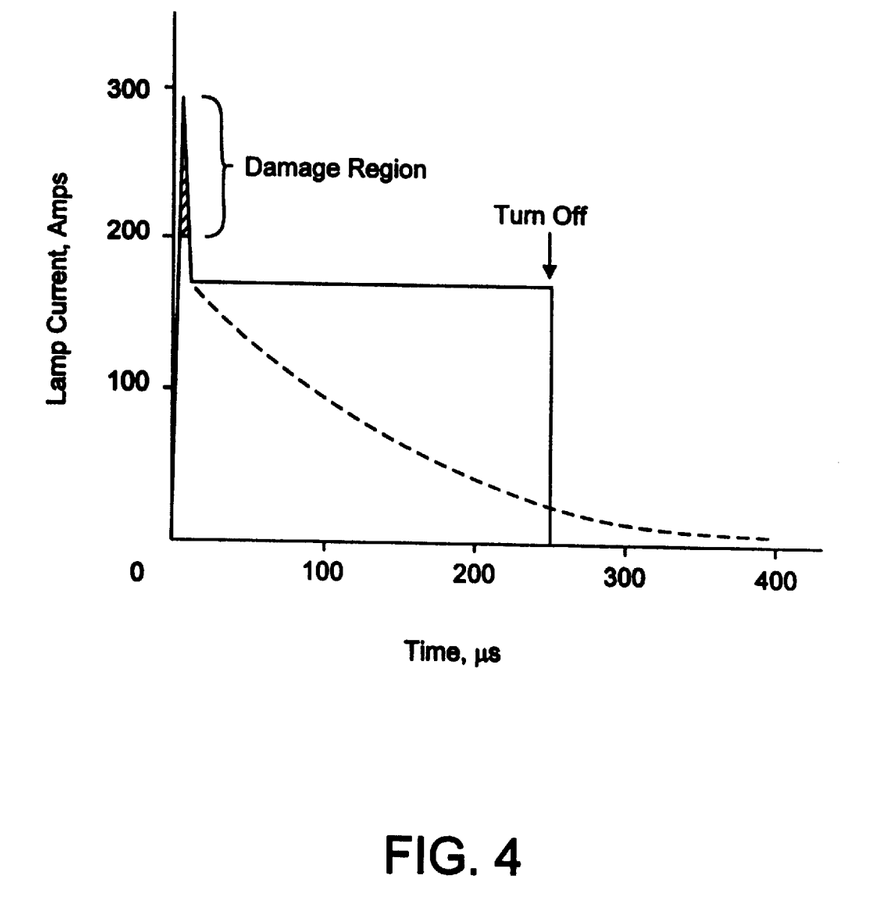
FIG. 4 is a representative discharge curve of amps vs. time in microseconds for the flashlamp circuit of the present invention.

Referring in detail now to FIGS. 3 and 4 for the flashlamp circuitry in accordance with the present invention, there is seen a preferred embodiment for the flashlamp circuitry, generally illustrated as 80, which includes the flashlamp circuitry 10 of FIG. 1 and additionally a capacitor 82. The capacitor 82 is electrically coupled by a conductor 84 to conductor 86 at junction 96. Conductor 86 electrically connects the end 24b of the secondary winding 24 of the transformer 20 to conductor 30, as best shown in FIG. 3. Capacitor 82 is grounded at 83.

Figure 5:
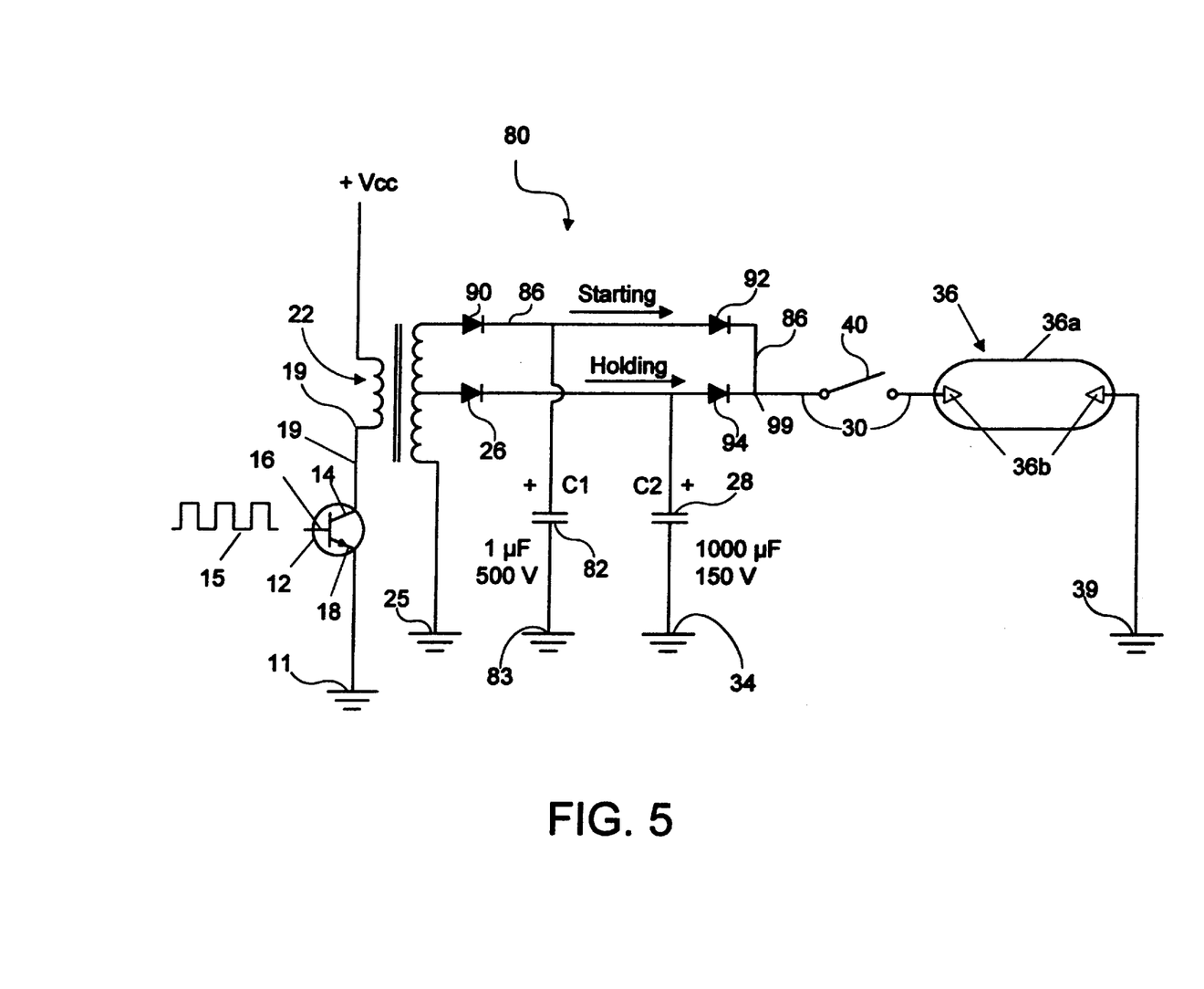
FIG. 5 is a schematic diagram of another embodiment of the flashlamp circuit for e present invention.

For the flashlamp circuitry 80 of the present invention, conductor 30 connects to an intermediate section 24c of the secondary winding 24 of the transformer 20 instead of to end 24b. Conductor 86 connects from the end 24b of the secondary winding 24 of the transformer 20 to junction 99 on conductor 30. The flashlamp circuitry 80 also includes rectifiers or diodes 90, 92 and 94. Rectifier 90 and rectifier 92 are both electrically, serially disposed in conductor 86 with rectifier 90 being between end 24b of the secondary winding 24 of the transformer 20 and the junction 96 where conductor 84 electrically connects to conductor 86, and with rectifier 92 being between junction 96 and junction 99 where conductor 86 connects to conductor 30. In the preferred embodiment of the invention depicted in FIG. 5, no trigger transformer 44 is employed. For this embodiment of the present invention, capacitor 82 would have a higher potential (e.g. about 300 volts, preferably about 400 volts or greater) than the capacitor 82 would have in the embodiment of the invention depicted in FIG. 3, and the flashlamp 36 would energize the moment that switch 40 closes.

Operating parameters for the circuit 80 may be selected from a wide range of values. By way of example only, capacitor 82 is a preferably small capacitor, charged to a high voltage to initiate the discharge of current through the flashlamp 36 after the trigger transformer 44 has applied a difference in potential to the outside surface 36a of the flashlamp 36 to ionize the gas contained therein. As previously indicated, switch 40 is closed before or simultaneously with the closing of switch 52. In a preferred embodiment of the present invention, capacitor 82 has a value ranging from about 0.1 $\mu$F to about 20 $\mu$F and is to be charged to a potential level ranging from about 300 volts to about 1000 volts. More preferably, capacitor 82 has a value ranging from about 0.5 $\mu$F to about 5 $\mu$F, most preferably from about 0.8 $\mu$F to about 2 $\mu$F. The charged voltage for capacitor 82 more preferably ranges from about 350 volts to about 650 volts, most preferably from about 450 volts to about 550 volts. As previously indicated, for the embodiment of the invention depicted in FIG. 5, capacitor 82 has a potential equal to or greater than about 300 volts, preferably about 400 volts.

By way of example only further, capacitor 28 is preferably a large capacitor, charged to a low voltage to sustain the discharge of current through the flashlamp 36 after the potential level of capacitor 82 has fallen or declined to the potential level of capacitor 28. In a preferred embodiment of the present invention, capacitor 28 has a value ranging from about 100 $\mu$F to about 5000 $\mu$F and is to be charged to a potential level ranging from about 80 volts to less than 300 volts. More preferably, capacitor 28 has a value ranging from about 500 $\mu$F to about 1500 $\mu$F, most preferably from about 800 $\mu$F to about 1200 $\mu$F. The charged voltage for capacitor 28 more preferably ranges from about 100 volts to about 250 volts, most preferably from about 150 volts to about 200 volts.

In the graph of FIG. 4, the solid line representation for the electrical discharge of capacitor 28 is for when capacitor 28 has a gate and possesses a large value, such as a value equal to or greater than about 200 $\mu$F (e.g. 1000 $\mu$F). The "turn off" point represents the opening of switch 40. The dotted line representation in FIG. 4 is the electrical discharge of capacitor 28 having a small value, such as a value equal to or less than about 150 $\mu$F (e.g. about 100 $\mu$F). The dotted line representation further represents a small value capacitor 28 being allowed to completely discharge without the necessity of opening switch 40.

The value of capacitors 28 and 82 and the size(s) and technical capabilities of NPN transistor 12 and rectifiers 26, 90, 92 and 94, as well as the amount of increased voltage produced by step up transformers 20 and 44 are within the knowledge of those artisans possessing the ordinary skill in the art and would depend on a number of factors, such as the type of flashlamp 36 including the particular noble gas employed, such as xenon vs. neon, etc. Similarly, the potential level to which the capacitors 28 and 82 are to be charged would also depend on similar factors. While the preferred, more preferred, and most preferred values for the capacitors 28 and 82 have been stated, it as to be understood that such stated values have been given by way of illustration only and are merely exemplary and not limiting.

In operation of the invention, capacitor 82 is a high voltage (i.e. a voltage equal to or greater than about 300 volts) capacitor to initiate the discharge of current through flashlamp 36 to illuminate the same, while capacitor 28 is a low voltage capacitor with a large value, say equal to or greater than 100 $\mu$F. Capacitor 28 is to sustain the discharge of current through flashlamp 36 that was commenced by capacitor 82 when the potential level of capacitor 82 is about equal to or less than the potential level of capacitor 28. When capacitor 28 commences to discharge, capacitor 82 will continue to discharge current through the flashlamp 36 for illumination purposes. When the discharge is started, the high voltage capacitor 82 discharges within a couple of microseconds, and the discharge path is then sustained by the low voltage capacitor 28. By this means, the total time that the flashlamp 36 experiences the most damaging region (e.g. the region where the current is greater than about 200 amps) is radically decreased, with a corresponding increase in the lamp life of the flashlamp 36 as best shown in FIG. 4.

The total time, in accordance with the practice of the present invention, that the flashlamp 36 would experience the damaging current would range from approximately 0.1 microseconds to about 25 microseconds, more preferably from about 0.1 microseconds to about 5 microseconds and most preferably from about 0.1 microseconds to about 2 microseconds (as best illustrated in FIG. 4); whereas the total time that the flashlamp 36 would experience damaging current in accordance with the prior art circuit of FIG. 1 would typically range from approximately 30 microseconds to about 70 microseconds. Thus, by the practice of the present invention the lamp life of an inexpensive flashlamp may be increased over twenty (20) times by application of this kind of shaping. It has been discovered that if starting capacitor 82 is small enough, such as about 0.6 $\mu$F or less, the flashlamp current has no damaging peak.

The invention will be illustrated by the following set forth example which is given by way of illustration to set forth the currently known best mode and not by way of any limitation. All parameters such as capacitor values, charged voltages, times, etc. submitted in this example are not to be construed to unduly limit the scope of the invention.

EXAMPLE

The circuit of FIG. 3 was used to illuminate the flashlamp 36 which was a standard small camera xenon flashlamp. Transformer 20 was a 40:1 step up transformer for increasing 12 volts to about 500 volts. Transformer 44 was a 15:1 step up 4 KV trigger transformer. Rectifiers 26 and 90 were 600 volt devices capable of handling 10 amps. Rectifiers 92 and 94 were 600 volt devices capable of withstanding a short surge of about 400 amps. Capacitor 82, the current starting capacitor, had a value of 1 $\mu$F and was charged to a potential of about 500 volts. Capacitor 28, the capacitor to sustain illumination of the flashlamp 36, had a value of 1000 $\mu$F. Capacitor 28 was charged to a potential of about 150 volts. Switch 52 was closed after switch 40 was closed. This resulted in the ionization of xenon gas within the flashlamp 36 from the difference of potential applied by trigger transformer 44 in proximity to the flashlamp 36. The closing of switch 52 after switch 40 was closed also resulted in the illumination of flashlamp 36 from the capacitor 82 discharging over 200 amps (the damage region) through flashlamp 36 for a period of time ranging from about 2 to about 5 microseconds (see graph of FIG. 4). When the potential of capacitor 82 declined below 150 volts, capacitor 28 began to discharge its associated electrical charge through flashlamp 36 at a current of about 175 amps as best shown in the solid-line discharge line for capacitor 28 in FIG. 4. Capacitor 28 continued to discharge its associated electrical charge through the flashlamp 36 with the current falling off to about 150 amps (as further best shown in FIG. 4) whereupon switch 40 was opened (see "turn off" point in graph of FIG. 4) to cease the electrical discharge of capacitor 28 and to turn off the flashlamp 36. The total lapsed time from the closing of switch 52 and the opening of switch 40 was about 250 microseconds as shown in FIG. 4.

Thus, while the present invention has been described herein with reference to particular embodiments thereof, a latitude of modification, various changes and substitutions are intended in the foregoing disclosure, and it will be appreciated that in. some instances some features of the invention will be employed without a corresponding use of other features without department from the scope of the invention as set forth.

We claim:

1. A method for operating a flashlamp comprising the steps of:
    a) electrically coupling a flashlamp to a first capacitive element and a second capacitive element, said second capacitive element having a capacitance substantially higher than said first capacitive element;
    b) charging said first capacitive element to a first potential level;
    c) substantially simultaneously with step (b), charging said second capacitive element to a second potential level lower than said first potential level;
    d) discharging the first capacitive element through said flashlamp; and
    e) subsequently discharging the second capacitive element through said flashlamp after the first capacitive element has been discharging through said flashlamp; whereby a high-current operational period of said flashlamp is minimized to thereby prolong a lifetime of said flashlamp.

2. The method of claim 1 wherein said second capacitive element begins to discharge through said flashlamp when a potential level of said first capacitive element falls below said second potential level.

3. The method of claim 1 wherein said first potential level is greater than about 300 volts.

4. The method of claim 2 wherein said first potential level is greater than about 300 volts.

5. The method of claim 1 additionally comprising applying a difference in potential to said flashlamp prior to said discharging step (d).

6. A circuit for illuninating a flashlamp comprising:
    a first capacitor, coupled to said flashlamp, for storing an electrical charge of a first potential;
    a second capacitor, coupled to said flashlamp, for storing an electrical charge of a second potential, said second potential being lower than said first potential;
    said first capacitor having a capacitance lower than said second capacitor;
    a first transformer electrically coupled to said first capacitor and to said second capacitor;
    a power means, electrically coupled to said transformer, for supplying electrical power to said transformer such that said transformer substantially simultaneously charges said first capacitor to said first potential and said second capacitor to said second potential;
    said first capacitor being operative to initially discharge current over a first characteristic discharge time to said flashlamp;

said second capacitor being operative to discharge current to said flashlamp subsequent to said first capacitor, said second capacitor discharging current to said flashlamp over a second characteristic discharge time substantially greater than said first characteristic discharge time;

whereby a high-current operation of said flashlamp is minimized to prolong a lifetime of the flashlamp.

7. The circuit of claim 6, wherein said second capacitor is operative to commence discharging current to said flashlamp when a potential of said first capacitor falls below said second potential.

8. The circuit of claim 6, wherein the circuit is configured such that a period during which a flashlamp current exceeds 200 amps is between 0.1 and 25 microseconds.

9. The circuit of claim 6, wherein the circuit is configured such that a period during which a flashlamp current exceeds 200 amps is between 0.1 and 5 microseconds.

10. The circuit of claim 6, further comprising a trigger transformer coupled to said flashlamp, for applying a potential across said flashlamp sufficient to cause gas contained within said flashlamp to ionize.

11. The method of claim 1, wherein a period during which a flashlamp current exceeds 200 amps is between 0.1 and 25 microseconds.

12. The method of claim 1, wherein a period during which a flashlamp current exceeds 200 amps is between 0.1 and 5 microseconds.

* * * * *